(12) United States Patent
Oota et al.

(10) Patent No.: US 9,748,342 B2
(45) Date of Patent: Aug. 29, 2017

(54) SEMICONDUCTOR DEVICE AND METHOD FOR MANUFACTURING THE SAME

(71) Applicant: Kabushiki Kaisha Toshiba, Minato-ku, Tokyo (JP)

(72) Inventors: Tsuyoshi Oota, Ibo Hyogo (JP); Yoichi Hori, Himeji Hyogo (JP); Atsuko Yamashita, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 14/854,738

(22) Filed: Sep. 15, 2015

(65) Prior Publication Data

US 2016/0276442 A1    Sep. 22, 2016

(30) Foreign Application Priority Data

Mar. 16, 2015   (JP) ................. 2015-051892

(51) Int. Cl.
| | | |
|---|---|---|
| *H01L 29/40* | (2006.01) | |
| *H01L 29/16* | (2006.01) | |
| *H01L 21/04* | (2006.01) | |
| *H01L 29/66* | (2006.01) | |
| *H01L 29/872* | (2006.01) | |

(Continued)

(52) U.S. Cl.
CPC ...... *H01L 29/1608* (2013.01); *H01L 21/0465* (2013.01); *H01L 21/0475* (2013.01); *H01L 21/0485* (2013.01); *H01L 21/0495* (2013.01); *H01L 29/0619* (2013.01); *H01L 29/6606* (2013.01); *H01L 29/872* (2013.01);
(Continued)

(58) Field of Classification Search
CPC ............. H01L 29/1608; H01L 29/0619; H01L 21/0475; H01L 21/0465; H01L 21/0485; H01L 21/0495; H01L 29/6606; H01L 29/872; H01L 27/0766; H01L 29/66143; H01L 29/66212; H01L 51/0579; H01L 2924/12032

See application file for complete search history.

(56) References Cited

U.S. PATENT DOCUMENTS

| | | | | |
|---|---|---|---|---|
| 2005/0173739 A1* | 8/2005 | Kusumoto | .......... | H01L 21/0485 257/263 |
| 2012/0228636 A1* | 9/2012 | Maeyama | .......... | H01L 29/0619 257/77 |

FOREIGN PATENT DOCUMENTS

| | | |
|---|---|---|
| JP | 2001-308107 A | 11/2001 |
| JP | 2012-186369 A | 9/2012 |
| JP | 2014-029975 A | 2/2014 |

* cited by examiner

*Primary Examiner* — Su C Kim
(74) *Attorney, Agent, or Firm* — White & Case LLP

(57) ABSTRACT

A semiconductor device according to an embodiment includes a first-conductivity-type SiC substrate, a first-conductivity-type SiC layer provided on the SiC substrate, having a first surface, and having a lower first-conductivity-type impurity concentration than the SiC substrate, first second-conductivity-type SiC regions provided in the first surface of the SiC layer, second second-conductivity-type SiC regions provided in the first SiC regions and having a higher second-conductivity-type impurity concentration than the first SiC region, silicide layers provided on the second SiC regions and having a second surface, a difference between a distance from the SiC substrate to the second surface and a distance from the SiC substrate to the first surface being equal to or less than 0.2 μm, a first electrode provided to contact with the SiC layer and the silicide layers, and a second electrode provided to contact with the SiC substrate.

15 Claims, 9 Drawing Sheets

(51) Int. Cl.
*H01L 29/06* (2006.01)
*H01L 27/07* (2006.01)
(52) U.S. Cl.
CPC .... *H01L 27/0766* (2013.01); *H01L 29/66143* (2013.01); *H01L 29/66212* (2013.01)

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-051892, filed on Mar. 16, 2015, the entire contents of which are incorporated herein by reference.

FIELD

Embodiments described herein relate generally to a semiconductor device and a method for manufacturing the same.

BACKGROUND

A merged PIN Schottky diode (MPS) is one example of the structure of a Schottky barrier diode (SBD). In the MPS, a depletion layer which is spread from an adjacent p-type layer is pinched off to reduce the electric field intensity of a Schottky electrode interface, which makes it possible to reduce a leakage current during reverse bias. In addition, an anode electrode comes into ohmic contact with the p-type layer. Therefore, when an anode voltage increases, holes are injected from the p-type layer and the conductivity of a drift layer is modulated. Therefore, the MPS has a high surge current resistance, similarly to the PIN diode.

In an MPS using silicon carbide (SiC), it is preferable to provide a silicide layer between a p-type layer and an anode electrode in order to bring the anode electrode into ohmic contact with the p-type layer. However, in this case, it is concern that degradation of characteristics, such as an increase in leakage current caused by the silicide layer will occur.

DETAILED DESCRIPTION

Figure 1:
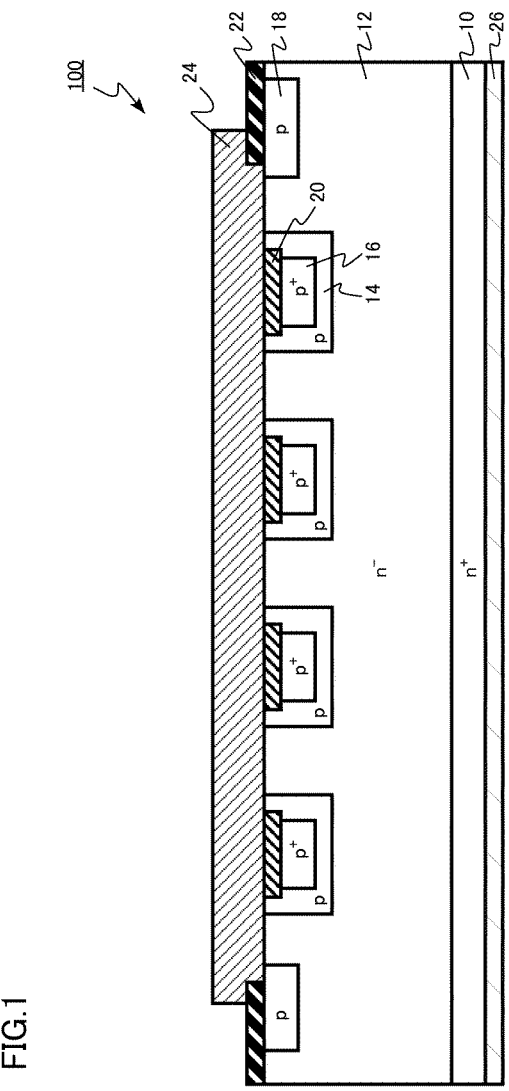
FIG. 1 is a cross-sectional view schematically illustrating a semiconductor device according to a first embodiment.

A semiconductor device according to an embodiment includes: a first-conductivity-type SiC substrate; a first-conductivity-type SiC layer provided on the first-conductivity-type SiC substrate, the first-conductivity-type SiC layer having a first surface, the first-conductivity-type SiC layer having a lower first-conductivity-type impurity concentration than the first-conductivity-type SiC substrate; a pair of first second-conductivity-type SiC regions provided at the first surface of the first-conductivity-type SiC layer; a pair of second second-conductivity-type SiC regions each provided in each of the first second-conductivity-type SiC regions, the second second-conductivity-type SiC regions having a higher second-conductivity-type impurity concentration than the first second-conductivity-type SiC regions; a pair of silicide layers each provided on each of the second second-conductivity-type SiC regions, the silicide layers having a second surface opposite to the second second-conductivity-type SiC region, a difference between a distance from the first-conductivity-type SiC substrate to the second surface and a distance from the first-conductivity-type SiC substrate to the first surface being equal to or less than 0.2 µm; a first electrode provided to contact with the first-conductivity-type SiC layer and the silicide layers; and a second electrode provided to contact with the first-conductivity-type SiC substrate.

Hereinafter, embodiments of the invention will be described with reference to the drawings. In the following description, for example, the same members are denoted by the same reference numerals and the description thereof will not be repeated.

In the following description, $n^+$, $n$, $n^-$, $p^+$, $p$, and $p^-$ indicate the relative impurity concentration levels of each conductivity type. That is, $n^+$ indicates that an n-type impurity concentration is high, as compared to n, and $n^-$ indicates that an n-type impurity concentration is low, as compared to n. In addition, $p^+$ indicates that a p-type impurity concentration is high, as compared to p, and $p^-$ indicates that a p-type impurity concentration is low, as compared to p. In addition, in some cases, an $n^+$ type and an $n^-$ type are simply referred to as an n type and a $p^+$ type and a $p^-$ type are simply referred to as a p type.

Impurity concentration can be measured by, for example, secondary ion mass spectrometry (SIMS). In addition, the relative impurity concentration level can be determined from the carrier concentration level calculated by, for example, scanning capacitance microscopy (SCM).

First Embodiment

A semiconductor device according to this embodiment includes: an n-type SiC substrate; an n-type SiC layer that is provided on the SiC substrate, has a first surface, and has a lower n-type impurity concentration than the SiC substrate; a plurality of first p-type SiC regions provided in the first surface of the SiC layer; a plurality of second p-type SiC regions that are provided in the first SiC regions and have a higher p-type impurity concentration than the first SiC region; a plurality of silicide layers that are provided on the second SiC regions and have a second surface opposite to the second SiC region, a difference between a distance from the SiC substrate to the second surface and a distance from the SiC substrate to the first surface being equal to or less than 0.2 µm; a first electrode provided so as to come into contact with the SiC layer and the silicide layers; and a second electrode provided so as to come into contact with the SiC substrate.

FIG. 1 is a cross-sectional view schematically illustrating the semiconductor device according to this embodiment. The semiconductor device according to this embodiment is an MPS.

An MPS 100 includes an n$^+$ cathode region (SiC substrate) 10, an n$^-$ drift layer (SiC layer) 12, a first p-type anode region (first SiC region) 14, a second p$^+$ anode region (second SiC region) 16, a p-type guard ring region 18, a silicide layer 20, a field oxide film 22, an anode electrode (first electrode) 24, and a cathode electrode (second electrode) 26.

Then n$^+$ cathode region (SiC substrate) 10 is, for example, a SiC substrate with a 4H—SiC structure. The n$^+$ cathode region 10 includes n-type impurities. The n-type impurity is, for example, nitrogen (N). The impurity concentration of the n-type impurities is, for example, equal to or greater than $1 \times 10^{19}$ cm$^{-3}$ and equal to or less than $1 \times 10^{21}$ cm$^{-3}$.

The n$^-$ drift layer (SiC layer) 12 is provided on the n$^+$ cathode region 10. The n$^-$ drift layer 12 includes n-type impurities. The n-type impurity is, for example, nitrogen (N). The impurity concentration of the n drift layer 12 is lower than the impurity concentration of the n$^+$ cathode region 10. The impurity concentration of the n-type impurities is, for example, equal to or greater than $1 \times 10^{15}$ cm$^{-3}$ and equal to or less than $2 \times 10^{16}$ cm$^{-3}$. The thickness of the n$^-$ drift layer 12 is, for example, equal to or greater than 3 µm and equal to or less than 30 µm.

An n-type buffer layer (not illustrated) which has an n-type impurity concentration between the impurity concentration of the n$^+$ cathode region 10 and the impurity concentration of the n$^-$ drift layer 12 may be provided between the n$^+$ cathode region 10 and the n$^-$ drift layer 12.

A plurality of first p-type anode regions (first SiC regions) 14 are provided in the surface of the n$^-$ drift layer 12. The first p-type anode region 14 includes p-type impurities. The p-type impurity is, for example, aluminum (Al). The impurity concentration of the p-type impurities is, for example, equal to or greater than $5 \times 10^{16}$ cm$^{-3}$ and equal to or less than $5 \times 10^{17}$ cm$^{-3}$.

The depth of the first p-type anode region 14 is, for example, equal to or greater than 0.5 µm and equal to or less than 2 µm. The width of the first p-type anode region 14 is, for example, equal to or greater than 1.0 µm and equal to or less than 10.0 µm. A gap between the first p-type anode regions 14 is, for example, equal to or greater than 1.0 µm and equal to or less than 5.0 µm.

The second p$^+$ anode region (second SiC region) 16 is provided in the first p-type anode region 14. The second p$^+$ anode region 16 is provided in the surface of the first p-type anode region 14. A plurality of second p$^+$ anode regions 16 is provided.

The second p$^+$ anode region 16 includes p-type impurities. The p-type impurity is, for example, aluminum (Al). The impurity concentration of the second p$^+$ anode region 16 is higher than the impurity concentration of the first p-type anode region 14. The impurity concentration of the p-type impurities is, for example, equal to or greater than $1 \times 10^{19}$ cm$^{-3}$ and equal to or less than $1 \times 10^{20}$ cm$^{-3}$.

The depth of the second p$^+$ anode region 16 is, for example, equal to or greater than 0.2 µm and equal to or less than 1.0 µm. The width of the second p$^+$ anode region 16 is, for example, equal to or greater than 0.5 µm and equal to or less than 8.0 µm.

The p-type guard ring region 18 is provided so as to surround the plurality of first p-type anode regions 14. The p-type guard ring region 18 is a termination structure for improving the breakdown voltage of the MPS 100.

The p-type guard ring region 18 includes p-type impurities. The p-type impurity is, for example, aluminum (Al). The impurity concentration of the p-type impurities is, for example, equal to or greater than $1 \times 10^{17}$ cm$^{-3}$ and equal to or less than $5 \times 10^{18}$ cm$^{-3}$.

The silicide layer 20 is provided on each of the plurality of second p$^+$ anode regions 16. A plurality of silicide layers 20 are provided. The silicide layer 20 is, for example, a nickel silicide layer. The thickness of the silicide layer 20 is, for example, equal to or greater than 0.05 µm and equal to or less than 0.5 µm.

The field oxide film 22 is provided on the p-type guard ring region 18. The field oxide film 22 is, for example, a silicon oxide film. The field oxide film 22 has an opening. The thickness of the field oxide film 22 is, for example, equal to or greater than 0.2 µm and equal to or less than 1.0 µm.

The anode electrode (first electrode) 24 comes into contact with the n$^-$ drift layer 12 and the silicide layer 20 in the opening of the field oxide film 22. A contact between the anode electrode 24 and the n$^-$ drift layer 12 is a Schottky contact. A contact between the anode electrode 24 and the silicide layer 20 is an ohmic contact.

The anode electrode 24 is made of metal. The anode electrode 24 is, for example, a stacked film of titanium (Ti) and aluminum (Al).

The cathode electrode 26 is provided so as to come into contact with the n$^+$ cathode region 10. It is preferable that a contact between the cathode electrode 26 and the n$^+$ cathode region 10 be an ohmic contact.

The cathode electrode 26 is made of metal. The cathode electrode 26 is, for example, a stacked film of titanium (Ti) and aluminum (Al).

Figure 2:
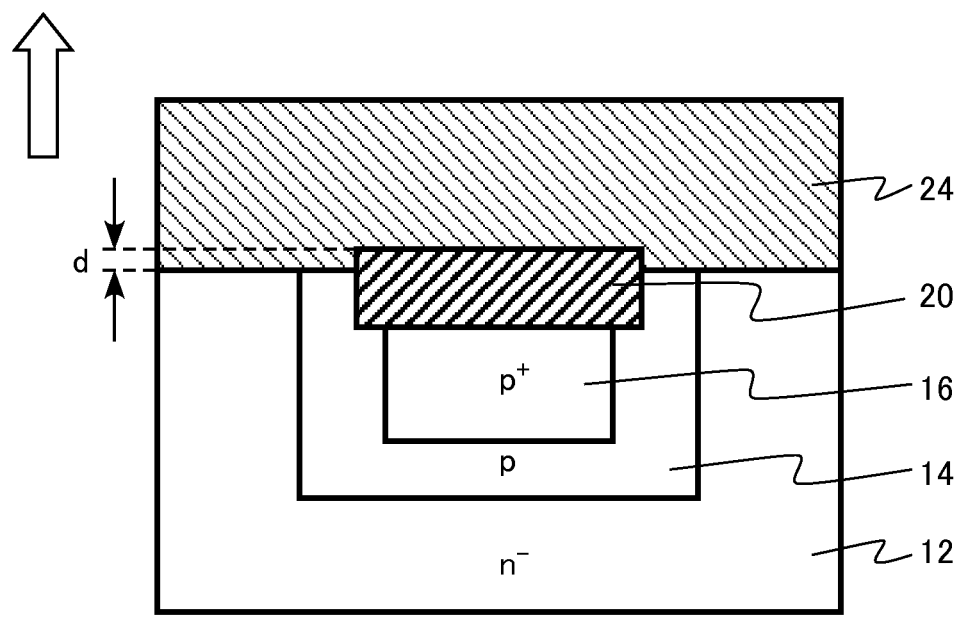
FIG. 2 is a cross-sectional view schematically illustrating a main portion of the semiconductor device according to the first embodiment.

FIG. 2 is a cross-sectional view schematically illustrating a main portion of the semiconductor device according to this embodiment. FIG. 2 is an enlarged view illustrating a portion of the MPS 100 including one first p-type anode region 14.

The surface of the n$^-$ drift layer 12 is referred to as a first surface. A surface of the silicide layer 20 which is opposite to the second p$^+$ anode region (second SiC region) 16 is referred to as a second surface. A direction from the n$^+$ cathode region 10 to the n$^-$ drift layer 12 (a white arrow in FIG. 2) is referred to as a positive direction.

In the MPS 100, a distance ("d" in FIG. 2) between the first surface and the second surface, that is, a distance between the surface of the n$^-$ drift layer 12 and the surface of the silicide layer 20 is equal to or less than 0.2 µm. In other words, a difference between the distance from the SiC substrate 10 to the second surface and the distance from the SiC substrate 10 to the first surface is equal to or less than 0.2 µm. It is preferable that the distance (difference) between the first surface and the second surface be equal to or greater than −0.1 µm and equal to or less than 0.1 µm.

Next, a method for manufacturing the semiconductor device according to this embodiment will be described. FIGS. 3A to 3H are cross-sectional views illustrating the method for manufacturing the semiconductor device according to this embodiment. FIGS. 3A to 3H are enlarged views illustrating a portion of the MPS 100 including one first p-type anode region 14.

The method for manufacturing the semiconductor device according to this embodiment includes: forming a first mask member on an n-type SiC layer; etching the first mask member to form an opening; performing a first ion implantation process of implanting p-type impurities into the SiC layer, using the first mask member as a mask; forming, on the first mask member, a second mask member having a thickness that is less than half the width of the opening; etching the second mask member to form a sidewall on a side surface of the opening; etching the SiC layer, using the first mask member and the sidewall as a mask, to forma groove; performing a second ion implantation process of implanting p-type impurities into the SiC layer, using the first mask member and the sidewall as a mask; forming a first metal film on the SiC layer; performing a heat treatment to react the first metal film with the SiC layer, thereby forming a silicide layer; removing the first metal film which has not been reacted; removing the first mask member and the sidewall; and forming a second metal film on the SiC layer and the silicide layer.

First, the n⁻ drift layer (SiC layer) 12 is formed on the n⁺ cathode region (SiC substrate) 10 (not illustrated in FIGS. 3A to 3H) (see FIG. 1) by an epitaxial growth method. Then, the p-type guard ring region 18 (not illustrated in FIGS. 3A to 3H) (see FIG. 1) is formed by ion implantation with p-type impurities.

Then, a first mask member 30 is formed on the n⁻ drift layer 12. The first mask member 30 is, for example, a silicon oxide film formed by a chemical vapor deposition (CVD) method.

Then, the first mask member 30 is etched to form an opening. The opening is formed by, for example, a lithography method and a reactive ion etching (RIE) method.

Figure 3A:
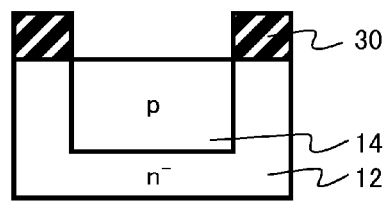
FIGS. 3A to 3H are cross-sectional views illustrating a method for manufacturing the semiconductor device according to the first embodiment.

Then, p-type impurities are implanted into the n⁻ drift layer 12 using the first mask member 30 as a mask (first ion implantation process). The first p-type anode region (first SiC region) 14 is formed by the first ion implantation process (FIG. 3A). The p-type impurity is, for example, aluminum (Al).

Figure 3B:
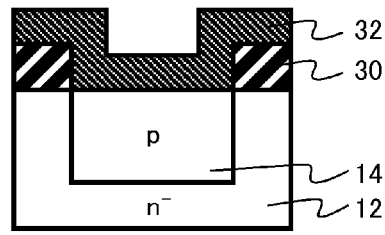

Then, a second mask member 32 having a thickness that is less than half the width of the opening is formed on the first mask member 30 (FIG. 3B). The opening is not completely filled with the second mask member 32. The second mask member 32 is, for example, a silicon oxide film formed by the CVD method.

Then, the second mask member 32 is etched to form a sidewall 34 on the side surface of the opening. The sidewall 34 is formed by, for example, overall etching using the RIE method.

Figure 3C:
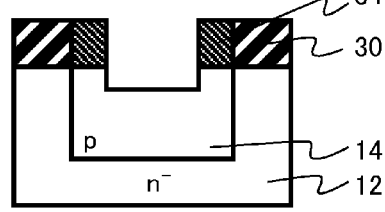

Then, the n⁻ drift layer 12 (first p-type anode region 14) is etched, using the first mask member 30 and the sidewall 34 as a mask, to forma groove (FIG. 3C). The groove is formed by, for example, the RIE method.

Figure 3D:
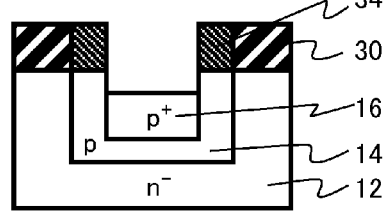

Then, p-type impurities are implanted into the n⁻ drift layer 12 (first p-type anode region 14), using the first mask member 30 and the sidewall 34 as a mask (second ion implantation process). The second p⁺ anode region (second SiC region) 16 is formed by the second ion implantation process (FIG. 3D).

Figure 3E:
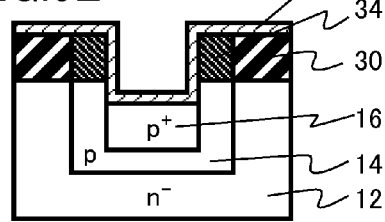

Then, a first metal film 36 is formed on the n⁻ drift layer 12 (second p⁺ anode region 16) (FIG. 3E). The first metal film 36 is formed by, for example, a sputtering method. The first metal film 36 is, for example, a nickel (Ni) film.

Figure 3F:
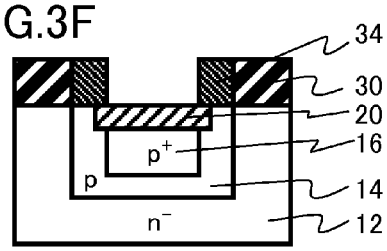

Then, a heat treatment is performed. The silicide layer 20 is formed by the reaction between the first metal film 36 and the n⁻ drift layer 12 (second p⁺ anode region 16) due to the heat treatment. Then, the first metal film 36 which has not reacted is removed (FIG. 3F). The first metal film 36 which has not reacted is removed by, for example, wet etching.

Figure 3G:
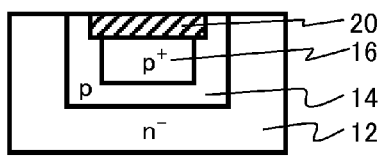

Then, the first mask member 30 and the sidewall 34 are removed (FIG. 3G). The first mask member 30 and the sidewall 34 are removed by, for example, wet etching.

Then, the field oxide film 22 (not illustrated in FIGS. 3A to 3H) (see FIG. 1) is formed. The field oxide film 22 is, for example, a silicon oxide film formed by the CVD method. The field oxide film 22 is patterned such that the silicide layer 20 is exposed.

Figure 3H:
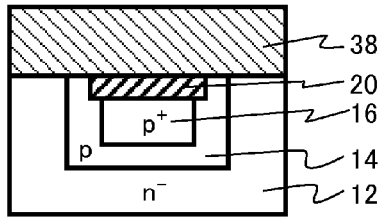

Then, a second metal film 38 is formed on the n⁻ drift layer 12 and the silicide layer 20 (FIG. 3H). The second metal film 38 is formed by, for example, the sputtering method. The second metal film 38 is, for example, a stacked film of titanium (Ti) and aluminum (Al).

Then, the second metal film 38 is patterned into an anode electrode. Then, a cathode electrode (not illustrated) is formed.

The MPS 100 illustrated in FIG. 1 is formed by the above-mentioned manufacturing method.

Next, the function and effect of the MPS 100 according to this embodiment will be described.

Figure 4:
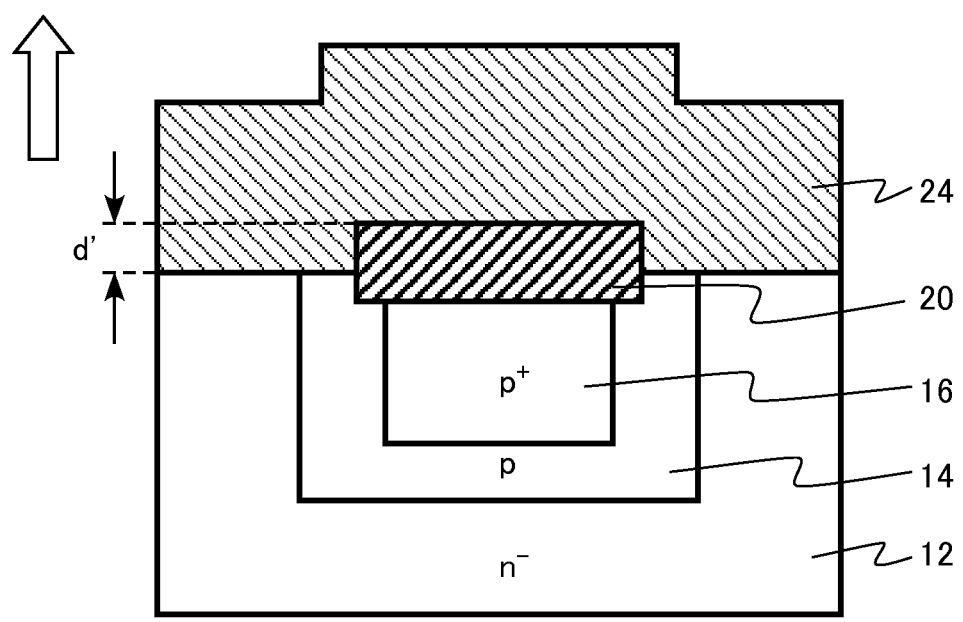
FIG. 4 is a cross-sectional view schematically illustrating a semiconductor device according to a comparative example.

FIG. 4 is a cross-sectional view schematically illustrating a semiconductor device according to a comparative example. The semiconductor device according to the comparative example is an MPS. The MPS according to the comparative example is similar to the semiconductor device according to the first embodiment except that the distance ("d" in FIG. 4) between the first surface and the second surface, that is, the distance between the surface of an n⁻ drift layer 12 and the surface of a silicide layer 20 is greater than 0.2 μm. In other words, the MPS according to the comparative example is similar to the semiconductor device according to the first embodiment except that the difference between the distance from a SiC substrate 10 to the second surface and the distance from the SiC substrate 10 to the first surface is greater than 0.2 μm.

As illustrated in FIG. 4, in the MPS according to the comparative example, the surface of the silicide layer 20 protrudes from the surface of the n⁻ drift layer 12. Therefore, a protrusion is formed on the surface of an anode electrode 24 formed on the silicide layer 20.

When the protrusion is formed on the surface of the anode electrode 24, there is a concern that a device failure will occur due to the protrusion during wire bonding onto the anode electrode 24. For example, the silicide layer 20 provided below the protrusion is broken by wire bonding impact. The breaking of the silicide layer 20 causes an increase in, for example, leakage current during reverse bias.

In the MPS 100 according to this embodiment, the distance between the surface of the n⁻ drift layer 12 and the surface of the silicide layer 20 is equal to or less than 0.2 μm. Therefore, the formation of a protrusion on the surface of the anode electrode 24 is prevented and a device failure is reduced. In addition, it is preferable that the distance between the surface of the n⁻ drift layer 12 and the surface of the silicide layer 20 be equal to or greater than −0.1 μm and equal to or less than 0.1 μm in order to prevent the occurrence of a device failure due to the shape of the surface of the anode electrode 24.

In the manufacturing method according to this embodiment, before the second p⁺ anode region 16 is formed by ion implantation, the groove is formed in the n⁻ drift layer 12. This process makes it possible to lower the surface of the silicide layer 20 to the substrate.

In addition, when the distance between the second p⁺ anode region 16 and the n⁻ drift layer 12 is too small, there is a concern that the amount of leakage current will increase during reverse bias. The reason is that, when a depletion layer reaches the second p⁺ anode region 16, a crystal defect in the second p⁺ anode region 16 becomes a leakage current source. In particular, when aluminum ions having a relatively large atomic radius are implanted into SiC, there is a concern that defects which occur during the ion implantation will not be recovered by a heat treatment and a large number of crystal defects will remain. This problem prevents scaling-down of the MPS.

Similarly, when the distance between the silicide layer 20 and the n⁻ drift layer 12 is too small, there is a concern that the depletion layer will reach the silicide layer 20 during reverse bias and the amount of leakage current will increase. This problem prevents scaling-down of the MPS.

In the manufacturing method according to this embodiment, the first p-type anode region 14 is formed using the first mask member 30 as a mask. Then, the second p⁺ anode region 16 and the silicide layer 20 are formed, using the sidewall 34 provided in the opening of the first mask member 30 as a mask. Therefore, the first p-type anode region 14, the second p⁺ anode region 16, and the silicide layer 20 are formed by self-alignment.

Therefore, it is possible to reduce the distance between the second p⁺ anode region 16 and the n⁻ drift layer 12 and the distance between the silicide layer 20 and the n⁻ drift layer 12. According to the manufacturing method according to this embodiment, it is possible to scale down the MPS.

According to the MPS 100 and the method for manufacturing the MPS 100 of this embodiment, it is possible to reduce a device failure caused by the silicide layer 20. In addition, it is possible to scale down the MPS.

Second Embodiment

A semiconductor device according to this embodiment is similar to the semiconductor device according to the first embodiment except that it further includes an insulating film which is provided between a side surface of a silicide layer and a first SiC region. Therefore, the description of the same content as that in the first embodiment will not be repeated.

Figure 5:
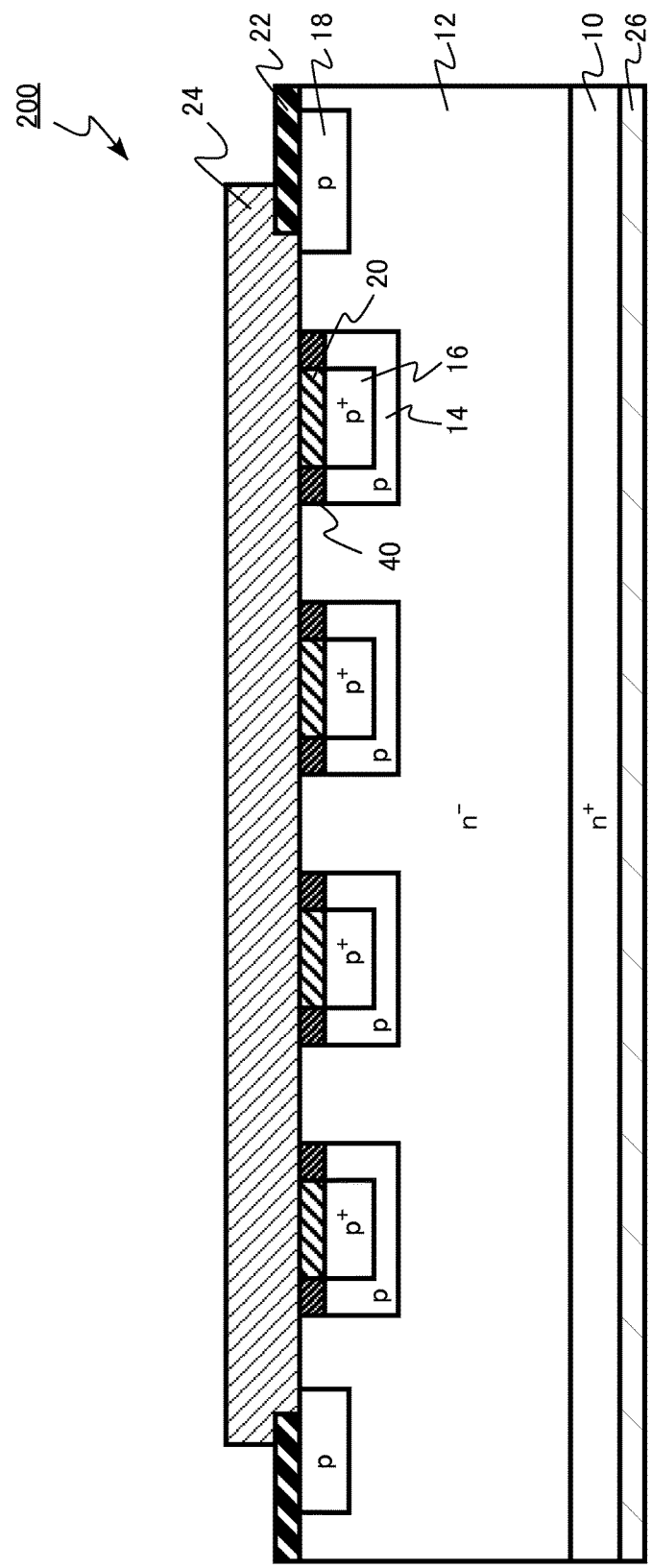
FIG. 5 is a cross-sectional view schematically illustrating a semiconductor device according to a second embodiment.

FIG. 5 is a cross-sectional view schematically illustrating the semiconductor device according to this embodiment. The semiconductor device according to this embodiment is an MPS.

An MPS 200 includes an insulating film 40 which is provided between a side surface of a silicide layer 20 and an n⁻ drift layer (SiC layer) 12. The insulating film 40 is interposed between an anode electrode (first electrode) 24 and a first p-type anode region (first SiC region) 14 in the vertical direction. The insulating film 40 is, for example, a silicon oxide film.

Next, a method for manufacturing the semiconductor device according to this embodiment will be described. FIGS. 6A to 6I are cross-sectional views illustrating the method for manufacturing the semiconductor device according to this embodiment. FIGS. 6A to 6I are enlarged views illustrating a portion of the MPS 200 including one first p-type anode region 14.

The method for manufacturing the semiconductor device according to this embodiment includes: forming a first mask member on an n-type SiC layer; etching the first mask member to form an opening; etching the SiC layer, using the first mask member as a mask, to form a groove; performing a first ion implantation process of implanting p-type impurities into the SiC layer, using the first mask member as a mask; forming, on the first mask member, a second mask member having a thickness that is less than half the width of the opening; etching the second mask member to form a first sidewall on a side surface of the opening; performing a second ion implantation process of implanting p-type impurities into the SiC layer, using the first mask member and the first sidewall as a mask; forming a first metal film on the SiC layer; performing a heat treatment to react the first metal film with the SiC layer, thereby forming a silicide layer; removing the first metal film which has not been reacted; removing the first mask member and a portion of the first sidewall to form a second sidewall on a side surface of the groove; and forming a second metal film on the SiC layer and the silicide layer.

First, the n⁻ drift layer (SiC layer) 12 is formed on an n⁺ cathode region (SiC substrate) 10 (not illustrated in FIGS. 6A to 6I) (see FIG. 5) by the epitaxial growth method. Then, a p-type guard ring region 18 (not illustrated in FIGS. 6A to 6I) (see FIG. 5) is formed by ion implantation with p-type impurities.

Then, a first mask member 30 is formed on the n⁻ drift layer 12. The first mask member 30 is, for example, a silicon oxide film formed by the CVD method.

Then, the first mask member 30 is etched to form an opening. The opening is formed by, for example, the lithography method and the RIE method.

Figure 6A:
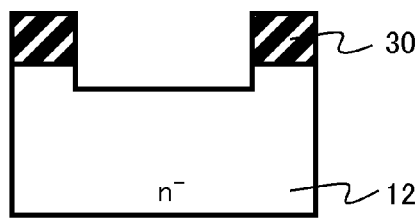
FIGS. 6A to 6I are cross-sectional views illustrating a method for manufacturing the semiconductor device according to the second embodiment.

Then, the n⁻ drift layer 12 is etched, using the first mask member 30 as a mask to form a groove (FIG. 6A). The groove is formed by, for example, the RIE.

Figure 6B:
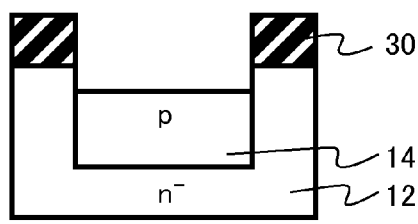

Then, p-type impurities are implanted into the n⁻ drift layer 12 using the first mask member 30 as a mask (first ion implantation process). The first p-type anode region (first SiC region) 14 is formed by the first ion implantation process (FIG. 6B). The p-type impurity is, for example, aluminum (Al).

Figure 6C:
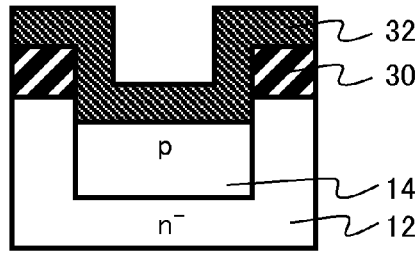

Then, a second mask member 32 having a thickness that is less than half the width of the opening is formed on the first mask member 30 (FIG. 6C). The opening is not completely filled with the second mask member 32. The second mask member 32 is, for example, a silicon oxide film formed by the CVD method.

Figure 6D:
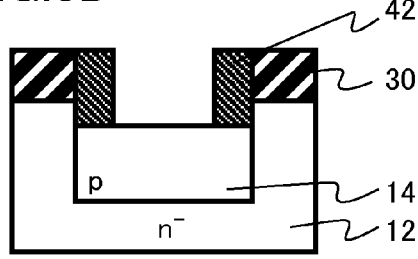

Then, the second mask member 32 is etched to form a first sidewall 42 on the side surface of the opening (FIG. 6D). The first sidewall 42 is formed by, for example, overall etching using the RIE method.

Figure 6E:
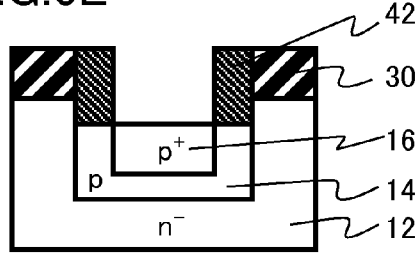

Then, p-type impurities are implanted into the n⁻ drift layer 12 (first p-type anode region 14), using the first mask member 30 and the first sidewall 42 as a mask (second ion implantation process). The second p⁺ anode region (second SiC region) 16 is formed by the second ion implantation process (FIG. 6E).

Figure 6F:
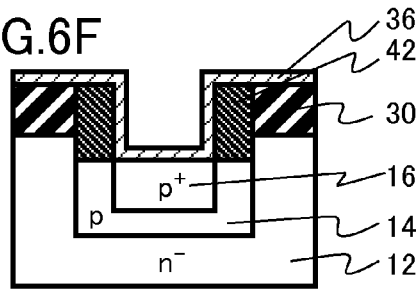

Then, a first metal film 36 is formed on the n⁻ drift layer 12 (second p⁺ anode region 16) (FIG. 6F). The first metal film 36 is formed by, for example, the sputtering method. The first metal film 36 is, for example, a nickel (Ni) film.

Figure 6G:
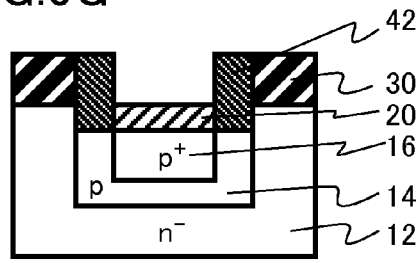

Then, a heat treatment is performed. The silicide layer 20 is formed by the reaction between the first metal film 36 and the n⁻ drift layer 12 (second p⁺ anode region 16) due to the heat treatment. Then, the first metal film 36 which has not reacted is removed (FIG. 6G). The first metal film 36 which has not reacted is removed by, for example, wet etching.

Figure 6H:
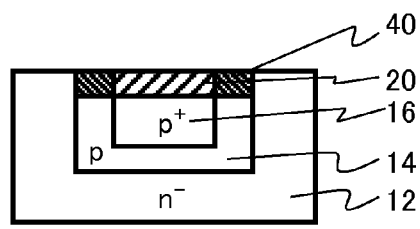

Then, the first mask member 30 and a portion of the first sidewall 42 are removed. At that time, a portion of the first sidewall 42 remains as a side surface of the groove to form a second sidewall (insulating film) 40 (FIG. 6H). The first mask member 30 and a portion of the first sidewall 42 are removed by, for example, overall etching using the RIE method.

Then, a field oxide film 22 (not illustrated in FIGS. 6A to 6I) (see FIG. 5) is formed. The field oxide film 22 is, for example, a silicon oxide film formed by the CVD method. The field oxide film 22 is patterned such that the silicide layer 20 is exposed.

Figure 6I:
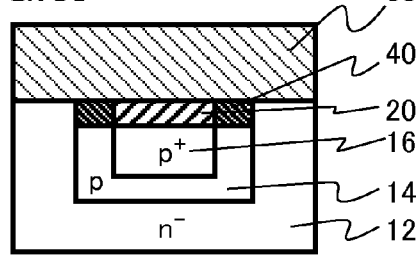

Then, a second metal film 38 is formed on the n⁻ drift layer 12 and the silicide layer 20 (FIG. 6I). The second metal film 38 is formed by, for example, the sputtering method. The second metal film 38 is, for example, a stacked film of titanium (Ti) and aluminum (Al).

Then, the second metal film 38 is patterned into an anode electrode. Then, a cathode electrode (not illustrated) is formed.

The MPS 200 illustrated in FIG. 5 is formed by the above-mentioned manufacturing method.

Next, the function and effect of the MPS 200 according to this embodiment will be described.

In the MPS 200 according to this embodiment, the distance (difference) between the surface of the n⁻ drift layer 12 and the surface of the silicide layer 20 is equal to or less than 0.2 μm. Therefore, similarly to the MPS 100 according to the first embodiment, the formation of a protrusion on the surface of the anode electrode 24 is prevented and a device failure is reduced.

In the manufacturing method according to this embodiment, before the first p-type anode region 14 is formed by ion implantation, the groove is formed in the n⁻ drift layer 12. This process makes it possible to lower the surface of the silicide layer 20 to the substrate.

In addition, when the distance between the silicide layer 20 and the n⁻ drift layer 12 is too small, there is a concern that a depletion layer will reach the silicide layer 20 during reverse bias and the amount of leakage current will increase. In the MPS 200 according to this embodiment, since the insulating film 40 is provided between the silicide layer 20 and the n⁻ drift layer 12, it is possible to prevent the depletion layer from reaching the silicide layer 20 during reverse bias. In addition, according to the method for manufacturing the MPS 200 of this embodiment, when the silicide layer 20 is formed, the extension of the silicide layer 20 to the n⁻ drift layer 12 is prevented. Therefore, it is possible to further reduce the distance between the silicide layer 20 and the n⁻ drift layer 12. According to the manufacturing method of this embodiment, it is possible to further scale down an MPS.

According to the MPS 200 and the method for manufacturing the MPS 200 of this embodiment, it is possible to reduce a device failure caused by the silicide layer 20. In addition, the formation of the insulating film 40 makes it possible to scale down an MPS.

Third Embodiment

A semiconductor device according to this embodiment includes: an n-type SiC substrate; an n-type SiC layer that is provided on the SiC substrate, has a first surface, and has a lower n-type impurity concentration than the SiC substrate; a first p-type SiC region provided in the first surface of the SiC layer; a plurality of second p-type SiC regions that are provided in the first SiC region and have a higher p-type impurity concentration than the first SiC region; a plurality of silicide layers that are provided on the second SiC regions and have a second surface opposite to the second SiC region; a first electrode provided so as to come into contact with the SiC layer and the silicide layers; and a second electrode provided so as to come into contact with the SiC substrate.

The semiconductor device according to this embodiment differs from the semiconductor device according to the first embodiment in that a first p-type SiC region has a large width. Hereinafter, the description of the same content as that in the first embodiment will not be repeated.

Figure 7:
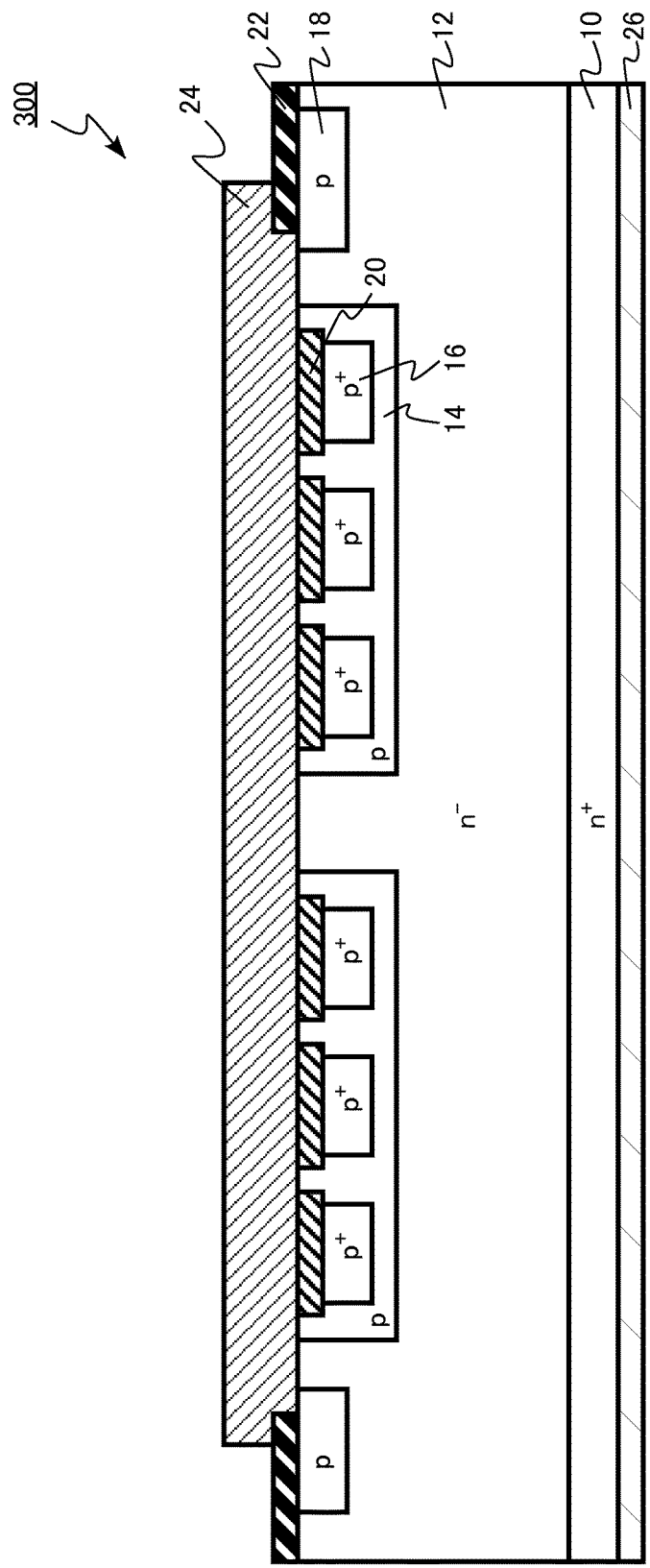
FIG. 7 is a cross-sectional view schematically illustrating a semiconductor device according to a third embodiment.

FIG. 7 is a cross-sectional view schematically illustrating the semiconductor device according to this embodiment. The semiconductor device according to this embodiment is an MPS.

The MPS 300 includes an n⁺ cathode region (SiC substrate) 10, an n⁻ drift layer (SiC layer) 12, a first p-type anode region (first SiC region) 14, a second p⁺ anode region (second SiC region) 16, a p-type guard ring region 18, a silicide layer 20, a field oxide film 22, an anode electrode (first electrode) 24, and a cathode electrode (second electrode) 26.

A plurality of second p⁺ anode regions 16 are provided in one first p-type anode region 14. In addition, the silicide layer 20 is provided on each of the second p⁺ anode regions 16.

Next, the function and effect of the MPS 300 according to this embodiment will be described.

Figure 8:
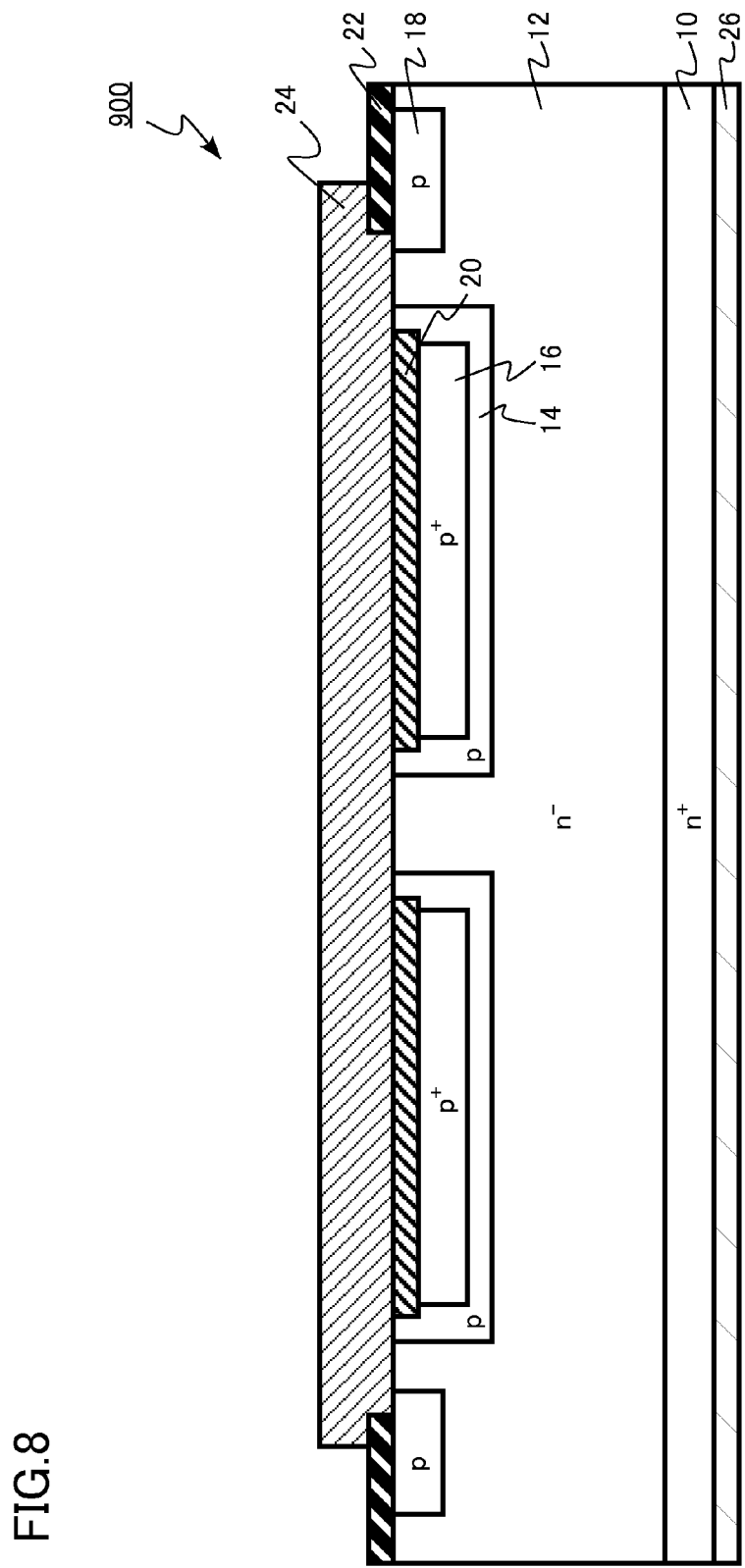
FIG. 8 is a cross-sectional view schematically illustrating a semiconductor device according to a comparative example.

FIG. 8 is a cross-sectional view schematically illustrating a semiconductor device according to a comparative example. The semiconductor device according to the comparative example is an MPS.

An MPS 900 according to the comparative example differs from the MPS 300 according to this embodiment in that one second p⁺ anode region 16 and one silicide layer 20 are provided in one first p-type anode region 14.

In the MPS 900 according to the comparative example, for example, the first p-type anode region 14 has a larger width than that in the MPS 100 according to the first embodiment. Therefore, the injection of minority carriers from the first p-type anode region 14 is accelerated and the conductivity of the n⁻ drift layer 12 is likely to be modulated. As a result, it is possible to achieve an MPS with a high surge current resistance.

However, as in the MPS 900, when the width of the silicide layer 20 is large, stress is increased by volume expansion during the formation of the silicide layer 20. Therefore, there is a concern that the amount of leakage current will increase when the MPS is reverse-biased.

In the MPS 300 according to this embodiment, the silicide layer 20 is divided and the width of the silicide layer 20 is small. Therefore, the influence of stress by volume expansion during the formation of the silicide layer 20 is reduced. As a result, it is possible to achieve the MPS 300 with a small leakage current.

It is preferable that the distance (difference) between the surface (first surface) of the n⁻ drift layer 12 and the surface (second surface) of the silicide layer 20 be equal to or less than 0.2 μm in order to prevent a protrusion from being formed on the surface of the anode electrode 24 and to reduce a failure which occurs during bonding. In other words, it is preferable that the difference between the distance from the SiC substrate 10 to the second surface and the distance from the SiC substrate 10 to the first surface be equal to or less than 0.2 μm. The distance (difference) between the surface of the n⁻ drift layer 12 and the surface of the silicide layer 20 is preferably equal to or greater than −0.1 μm and equal to or less than 0.1 μm. It is more preferable that the distance be 0 μm, that is, the surface of the n⁻ drift layer 12 be flush with the surface of the silicide layer 20.

According to the MPS 300 of this embodiment, it is possible to reduce a device failure caused by the silicide layer 20. In addition, according to the MPS 300 of this embodiment, it is possible to obtain a high surge current resistance. In the MPS 300 according to this embodiment, the plurality of second p⁺ anode regions 16 and the silicide layers 20 provided on the plurality of second p⁺ anode regions 16 can be simultaneously formed by the same method as that in the first embodiment. Therefore, it is easy to manufacture the MPS 300.

Fourth Embodiment

A semiconductor device according to this embodiment includes: an n-type SiC substrate; an n-type SiC layer that is provided on the SiC substrate, has a first surface, and has a lower n-type impurity concentration than the SiC substrate; a first p-type SiC region provided in the first surface of the SiC layer; a second p-type SiC region that is provided in the first SiC region and has a higher p-type impurity concentration than the first SiC region; a plurality of silicide layers that are provided on the second SiC region and have a second surface opposite to the second SiC region; a first electrode provided so as to come into contact with the SiC layer and the silicide layers; and a second electrode provided so as to come into contact with the SiC substrate.

The semiconductor device according to this embodiment is similar to the semiconductor device according to the third embodiment except that one second p-type SiC region is provided in one first p-type SiC region. Therefore, the description of the same content as that in the third embodiment will not be repeated.

Figure 9:
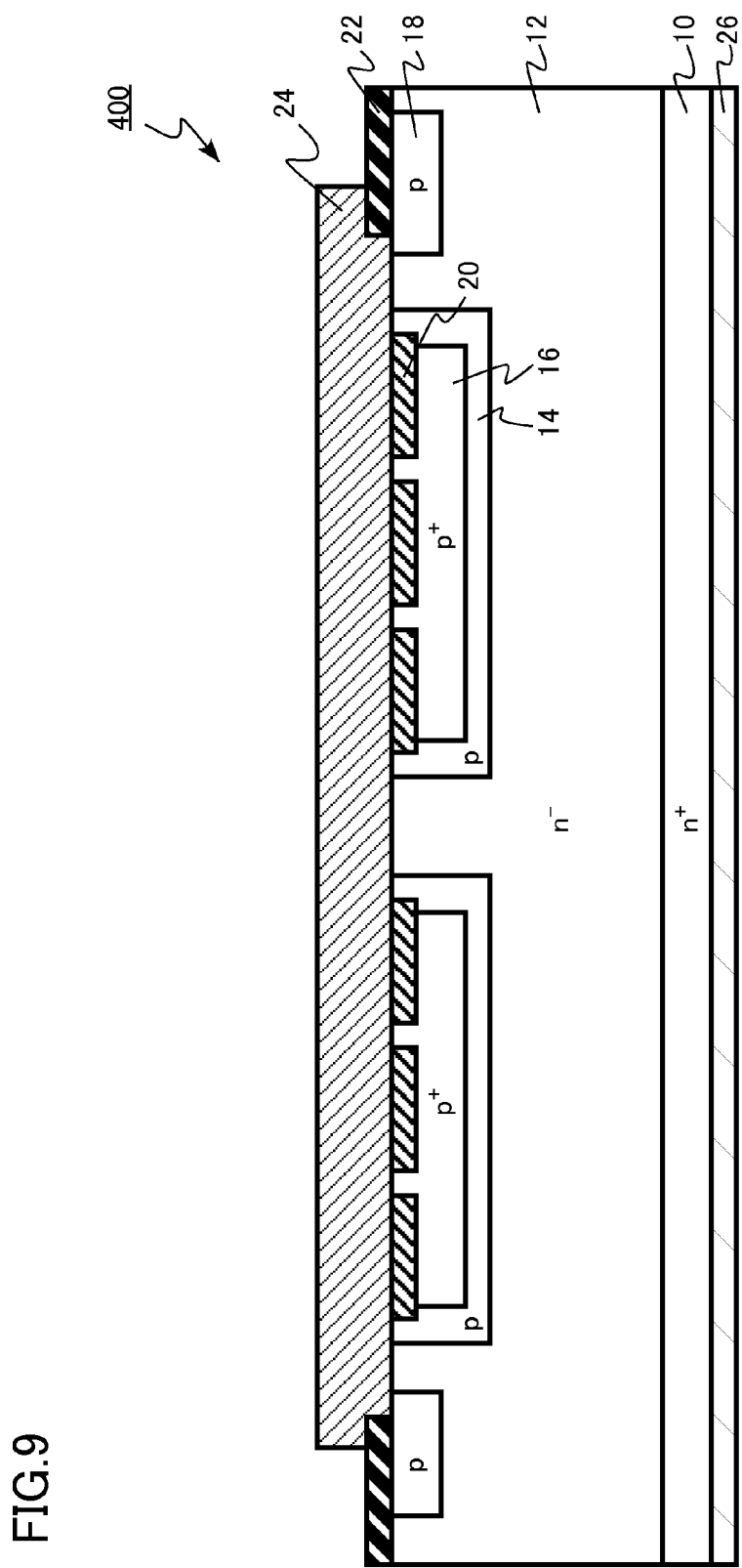
FIG. 9 is a cross-sectional view schematically illustrating a semiconductor device according to a fourth embodiment.

FIG. 9 is a cross-sectional view schematically illustrating the semiconductor device according to this embodiment. The semiconductor device according to this embodiment is an MPS.

An MPS 400 includes an n$^+$ cathode region (SiC substrate) 10, a n$^-$ drift layer (SiC layer) 12, a first p-type anode region (first SiC region) 14, a second p$^+$ anode region (second SiC region) 16, a p-type guard ring region 18, a silicide layer 20, a field oxide film 22, an anode electrode (first electrode) 24, and a cathode electrode (second electrode) 26.

One second p$^+$ anode region 16 is provided in one first p-type anode region 14. A plurality of silicide layers 20 are provided on one second p$^+$ anode region 16.

The MPS 400 according to this embodiment has the same function and effect as the MPS according to the third embodiment.

The second p$^+$ anode region 16 has a larger width than that in the MPS according to the third embodiment. Therefore, the injection of minority carriers from the first p-type anode region 14 is accelerated and the conductivity of the n$^-$ drift layer 12 is likely to be modulated. As a result, it is possible to achieve an MPS with a high surge current resistance.

It is preferable that the distance between the surface (first surface) of the n$^-$ drift layer 12 and the surface (second surface) of the silicide layer 20 be equal to or less than 0.2 μm in order to prevent a protrusion from being formed on the surface of the anode electrode 24 and to reduce a failure which occurs during bonding. In other words, it is preferable that the difference between the distance from the SiC substrate 10 to the second surface and the distance from the SiC substrate 10 to the first surface be equal to or less than 0.2 μm. The distance (difference) between the surface of the n$^-$ drift layer 12 and the surface of the silicide layer 20 is preferably equal to or greater than −0.1 μm and equal to or less than 0.1 μm. It is more preferable that the distance be 0 μm, that is, the surface of the n$^-$ drift layer 12 be flush with the surface of the silicide layer 20.

According to the MPS 400 of this embodiment, it is possible to reduce a device failure caused by the silicide layer 20. In addition, according to the MPS 400 of this embodiment, it is possible to obtain a high surge current resistance.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first-conductivity-type SiC substrate;
a first-conductivity-type SiC layer provided on the first-conductivity-type SiC substrate, the first-conductivity-type SiC layer having a first surface, the first-conductivity-type SiC layer having a lower first-conductivity-type impurity concentration than the first-conductivity-type SiC substrate;
a pair of first second-conductivity-type SiC regions provided at the first surface of the first-conductivity-type SiC layer;
a pair of second second-conductivity-type SiC regions each provided in each of the first second-conductivity-type SiC regions, the second second-conductivity-type SiC regions having a higher second-conductivity-type impurity concentration than the first second-conductivity-type SiC regions;
a pair of silicide layers each provided on each of the second second-conductivity-type SiC regions, the silicide layers having a second surface opposite to the second second-conductivity-type SiC region, a difference between a distance from the first-conductivity-type SiC substrate to the second surface and a distance from the first-conductivity-type SiC substrate to the first surface being equal to or greater than −0.1 μm and equal to or less than 0.1 μm;
a first electrode provided to contact with the first-conductivity-type SiC layer and the silicide layers; and
a second electrode provided to contact with the first-conductivity-type SiC substrate.

2. The device according to claim 1, further comprising:
an insulating film provided between a side surface of each of the silicide layers and the first-conductivity-type SiC layer, the insulating film contacting the side surface.

3. The device according to claim 1, wherein the silicide layers are nickel silicide layers.

4. The device according to claim 2, wherein the insulating film is a silicon oxide film.

5. A semiconductor device comprising:
a first-conductivity-type SiC substrate;
a first-conductivity-type SiC layer provided on the first-conductivity-type substrate, the first-conductivity-type SiC layer having a first surface, the first-conductivity-type SiC layer having a lower first-conductivity-type impurity concentration than the first-conductivity-type SiC substrate;
a pair of first second-conductivity-type SiC regions provided at the first surface of the SiC layer;
a pair of second second-conductivity-type SiC regions provided in each of the first second-conductivity-type SiC regions, the second second-conductivity-type SiC regions having a higher second-conductivity-type impurity concentration than the first second-conductivity-type SiC region;

a plurality of silicide layers each provided on each of the second second-conductivity-type SiC regions, each of the silicide layers having a second surface opposite to the second second-conductivity-type SiC region;

a first electrode provided to contact with the first-conductivity-type SiC layer and the silicide layers; and a second electrode provided to contact with the SiC substrate, wherein a difference between a distance from the first-conductivity-type SiC substrate to the second surface and a distance from the first-conductivity-type SiC substrate to the first surface is equal to or greater than −0.1 μm and equal to or less than 0.1 μm.

6. The device according to claim 5, wherein the silicide layers are nickel silicide layers.

7. A semiconductor device comprising:
a first-conductivity-type SiC substrate;
a first-conductivity-type SiC layer provided on the SiC substrate, the first-conductivity-type SiC layer having a first surface, the first-conductivity-type SiC layer having a lower first-conductivity-type impurity concentration than the first-conductivity-type SiC substrate;
a pair of first second-conductivity-type SiC regions provided in the first surface of the first-conductivity-type SiC layer;
a pair of second second-conductivity-type SiC regions each provided in each of the first second-conductivity-type SiC regions, the first second-conductivity-type SiC regions having a higher second-conductivity-type impurity concentration than the first second-conductivity-type SiC region;
a plurality of silicide layers provided on each of the second second-conductivity-type SiC regions, the silicide layers having a second surface opposite to the second second-conductivity-type SiC region;
a first electrode provided to contact with the first-conductivity-type SiC layer and the silicide layers; and
a second electrode provided to contact with the first-conductivity-type SiC substrate,
wherein a difference between a distance from the first-conductivity-type SiC substrate to the second surface and a distance from the first-conductivity-type SiC substrate to the first surface is equal to or greater than −0.1 μm and equal to or less than 0.1 μm.

8. The device according to claim 7,
wherein the silicide layers are nickel silicide layers.

9. A method for manufacturing a semiconductor device, comprising:
forming a first mask member on an first-conductivity-type SiC layer;
etching the first mask member to form an opening;
performing a first ion implantation process of implanting second-conductivity-type impurities into the SiC layer, using the first mask member as a mask;
forming, on the first mask member, a second mask member having a thickness less than half the width of the opening;
etching the second mask member to form a sidewall on a side surface of the opening;
etching the SiC layer, using the first mask member and the sidewall as a mask, to form a groove;

performing a second ion implantation process of implanting second-conductivity-type impurities into the SiC layer, using the first mask member and the sidewall as a mask;
forming a first metal film on the SiC layer;
performing a heat treatment to react the first metal film with the SiC layer, thereby forming a silicide layer;
removing the first metal film having not been reacted;
removing the first mask member and the sidewall; and
forming a second metal film on the SiC layer and the silicide layer.

10. The method according to claim 9, wherein the metal film is a nickel film.

11. A method for manufacturing a semiconductor device, comprising:
forming a first mask member on an first-conductivity-type SiC layer;
etching the first mask member to form an opening;
etching the SiC layer, using the first mask member as a mask, to form a groove;
performing a first ion implantation process of implanting second-conductivity-type impurities into the SiC layer, using the first mask member as a mask;
forming, on the first mask member, a second mask member having a thickness less than half the width of the opening;
etching the second mask member to form a first sidewall on a side surface of the opening;
performing a second ion implantation process of implanting second-conductivity-type impurities into the SiC layer, using the first mask member and the first sidewall as a mask;
forming a first metal film on the SiC layer;
performing a heat treatment to react the first metal film with the SiC layer, thereby forming a silicide layer;
removing the first metal film having not been reacted;
removing the first mask member and a portion of the first sidewall to form a second sidewall on a side surface of the groove; and
forming a second metal film on the SiC layer and the silicide layer.

12. The method according to claim 11, wherein the metal film is a nickel film.

13. A semiconductor device comprising:
a first-conductivity-type SiC substrate;
a first-conductivity-type SiC layer provided on the first-conductivity-type SiC substrate, the first-conductivity-type SiC layer having a first surface, the first-conductivity-type SiC layer having a lower first-conductivity-type impurity concentration than the first-conductivity-type SiC substrate;
a pair of first second-conductivity-type SiC regions provided at the first surface of the first-conductivity-type SiC layer;
a pair of second second-conductivity-type SiC regions each provided in each of the first second-conductivity-type SiC regions, the second second-conductivity-type SiC regions having a higher second-conductivity-type impurity concentration than the first second-conductivity-type SiC regions;
a pair of silicide layers each provided on each of the second second-conductivity-type SiC regions, the silicide layers having a second surface opposite to the second second-conductivity-type SiC region, a distance between the first surface and the second surface being equal to or less than 0.2 μm when taking a direction from the first-conductivity-type SiC substrate towards the first-conductivity-type SiC layer as positive direction;

a first electrode provided to contact with the first-conductivity-type SiC layer and the silicide layers; and a second electrode provided to contact with the first-conductivity-type SiC substrate.

14. The device according to claim 13, further comprising:

an insulating film provided between a side surface of each of the silicide layers and each of the first second-conductivity-type SiC regions.

15. The device according to claim 13, wherein the distance is equal to or greater than −0.1 μm and equal to or less than 0.1 μm.

* * * * *